(12) United States Patent
Nguyen et al.

(10) Patent No.: US 8,648,460 B2
(45) Date of Patent: Feb. 11, 2014

(54) THERMAL INTERFACE MATERIAL WITH EPOXIDIZED NUTSHELL OIL

(75) Inventors: My Nhu Nguyen, Poway, CA (US); Chew Beng Chan, Chino Hills, CA (US)

(73) Assignee: Henkel US IP LLC, Rocky Hill, CT (US)

( * ) Notice: Subject to any disclaimer, the term of this patent is extended or adjusted under 35 U.S.C. 154(b) by 56 days.

(21) Appl. No.: 13/439,091

(22) Filed: Apr. 4, 2012

(65) Prior Publication Data
US 2012/0187556 A1   Jul. 26, 2012

Related U.S. Application Data

(63) Continuation of application No. PCT/US2010/053929, filed on Oct. 25, 2010.

(60) Provisional application No. 61/255,306, filed on Oct. 27, 2009.

(51) Int. Cl.
*H01L 23/34* (2006.01)

(52) U.S. Cl.
USPC .......................... 257/712; 257/76; 257/E23.08

(58) Field of Classification Search
USPC ................. 257/76, 712, E23.08; 165/85, 185
See application file for complete search history.

(56) References Cited

U.S. PATENT DOCUMENTS

| | | | |
|---|---|---|---|
| 4,322,325 A | 3/1982 | Esser et al. | |
| 5,719,255 A | 2/1998 | Heucher et al. | |
| 6,114,413 A | 9/2000 | Kang et al. | |
| 6,395,385 B1 | 5/2002 | Chang et al. | |
| 6,451,422 B1 | 9/2002 | Nguyen | |
| 6,888,257 B2 * | 5/2005 | Wilson et al. | 257/783 |
| 6,908,669 B2 | 6/2005 | Nguyen | |
| 7,311,967 B2 | 12/2007 | Dani et al. | |
| 7,551,346 B2 | 6/2009 | Fazel et al. | |
| 2002/0175316 A1 | 11/2002 | Shimizu et al. | |
| 2003/0134454 A1 | 7/2003 | Houle | |
| 2003/0152764 A1 | 8/2003 | Bunyan et al. | |
| 2007/0179232 A1 | 8/2007 | Collins et al. | |
| 2010/0087567 A1* | 4/2010 | Finter et al. | 523/400 |
| 2011/0060105 A1* | 3/2011 | Sprenger | 525/90 |

* cited by examiner

Primary Examiner — Roy Potter
(74) Attorney, Agent, or Firm — Steven C. Bauman

(57) ABSTRACT

A thermal interface material comprises an epoxy resin derived from nutshell oil or an epoxidized dimer fatty acid, or both, and fusible metal particles substantially devoid of added lead. Optionally, the TIM comprises a catalyst for the epoxy functionality.

11 Claims, 2 Drawing Sheets

THERMAL INTERFACE MATERIAL WITH EPOXIDIZED NUTSHELL OIL

CROSS-REFERENCE TO RELATED APPLICATIONS

This application is a continuation of International Patent Application No. PCT/US2010/053929 filed Oct. 25, 2010, which claims the priority to U.S. Patent Application Ser. No. 61/255,306 filed Oct. 27, 2009, the contents of both of which are incorporated herein by reference.

FIELD OF THE INVENTION

This invention relates to a thermally conductive material that is utilized to transfer heat from a heat-generating electronic device to a heat sink that absorbs and dissipates the transferred heat.

BACKGROUND OF THE INVENTION

Electronic devices containing semiconductors generate a significant amount of heat during operation. The level of heat generated is related to the performance of the semiconductor, with more highly performing devices generating greater levels of heat. In order to cool the semiconductors, which must be cooled in order to obtain appreciable performance, heat sinks are affixed to the device. In operation, heat generated during use is transferred from the semiconductor to the heat sink where the heat is harmlessly dissipated. In order to maximize the heat transfer from the semiconductor to the heat sink, a thermally conductive material, known as a thermal interface material (TIM), is utilized. The TIM ideally provides intimate contact between the heat sink and the semiconductor to facilitate the heat transfer.

There are various types of TIMs currently used by semiconductor manufacturers, all with their own advantages and disadvantages. For those semiconductors generating significantly high levels of heat, a preferred thermal solution is the use of solder materials. Examples of solder materials are pure indium, or alloys of indium and silver, or alloys of tin, silver, and copper, or alloys of indium, tin, and bismuth. These materials provide high thermal conductivity (30 to 50 W/m-K), but they are prone to cracking and delamination under stress.

Thus, it would be advantageous to provide a thermal interface material that is easy to handle and apply, yet also provides a high thermal conductivity and reliable performance.

SUMMARY OF THE INVENTION

This invention is a composition for use as a thermal interface material in a heat-generating, semiconductor-containing device comprising solder materials, an epoxy resin derived from nut oil and for an epoxidized dimer fatty acid. The solder materials, in one embodiment, are prepared from pure indium or a combination of pure indium with an alloy of tin and bismuth. The metal particles are substantially devoid of added lead. The presence of the epoxy resin derived from nut oil and for an epoxidized dimer fatty acid makes the composition more flexible, thus preventing cracking and increasing the contact between the heat sink and the semiconductor. A catalyst is an optional component of the TIM.

In another embodiment, this invention is an electronic device containing a heat-generating component, a heat sink and a thermal interface material according to the above description.

The use of the epoxy resin derived from nut oil and/or of the epoxidized dimer fatty acid provides an optimum range of modulus for the thermal interface material. These epoxies perform two functions in the composition: they act as fluxing agents for the solder particles and they form a gel-like or tacky mass that physically keeps the solder particles connected. Both of these functions enable the formation of a solder alloy in situ and help it to remain in place within the thermal interface material, thus keeping the thermal impedance stable over time.

DETAILED DESCRIPTION OF THE INVENTION

The thermal interface material of the present invention may be utilized with any heat-generating component for which heat dissipation is required, and in particular, for heat-generating components in semiconductor devices. In such devices, the thermal interface material forms a layer between the heat-generating component and the heat sink and transfers the heat to be dissipated to the heat sink. The thermal interface material may also be used in a device containing a heat spreader. In such a device, a layer of thermal interface material is placed between the heat-generating component and the heat spreader, and a second layer of thermal interface material is placed between the heat spreader and the heat sink.

The epoxy resin derived from nutshell oil comprises one or both of the following structures:

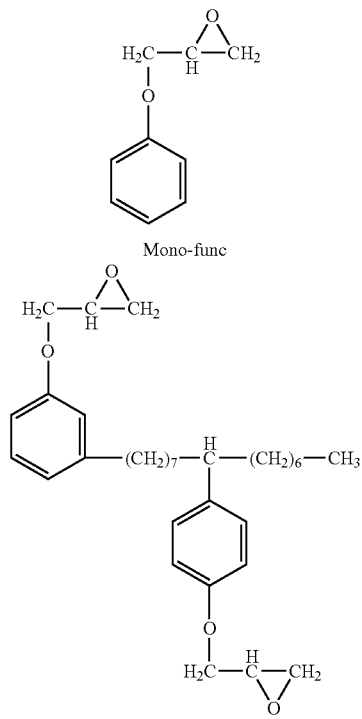

These resins are commercially available from Cardolite Corporation in New Jersey. Either the monofunctional epoxy or the difunctional epoxy or a blend of any ratios is equally effective as a fluxing agent for the alloying of solder powders within this invention and for the formation of the gel-like mass that holds the solder particles together.

The epoxidized dimer fatty acids are the reaction products of dimer fatty acids and epichlorohydrin. In one embodiment, the epoxidized dimer fatty acid has the following structure in which R is a 34 carbon chain represented as $C_{34}H_{68}$:

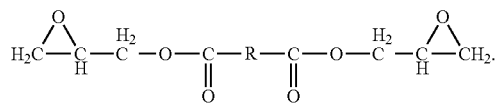

$R = C_{34}H_{68}$

It is commercially available from CVC Chemical in New Jersey.

The epoxy resins derived from the nutshell oil and/or the epoxidized dimer fatty acids will be present in the composition within a range of 2 to 30 weight percent, including the metal particles. The preferred ratios of epoxy nutshell to epoxy dimer fatty acid when both are present are about 9:1 to about 1:1.

The use of a catalyst for the epoxy functionality is optional, but any catalyst known in the art suitable for polymerizing or curing epoxy functionality may be used. Examples of suitable catalysts include peroxides and amines. When present, the catalyst will be used in an effective amount; in one embodiment, an effective amount ranges from 0.2 to 2 weight percent of the composition.

The metal particles suitable for use in the thermal interface composition are fusible metal particles, typically low melting point metals or metal alloys used as solders. Examples of such metals include bismuth, tin, and indium, and may also include silver, zinc, copper, antimony, and silver coated boron nitride. In one embodiment the metal particles are selected from tin, bismuth, or both. In another embodiment, indium will also be present. Alloys of the above metals also can be used.

In preferred embodiments, the metal particles are selected from tin, bismuth, an alloy of tin: bismuth, indium, silver coated boron nitride, and mixtures of these. The metal particles and/or alloys will be present in the composition in a range from 50 to 95 weight percent of the total composition.

Figure 2:
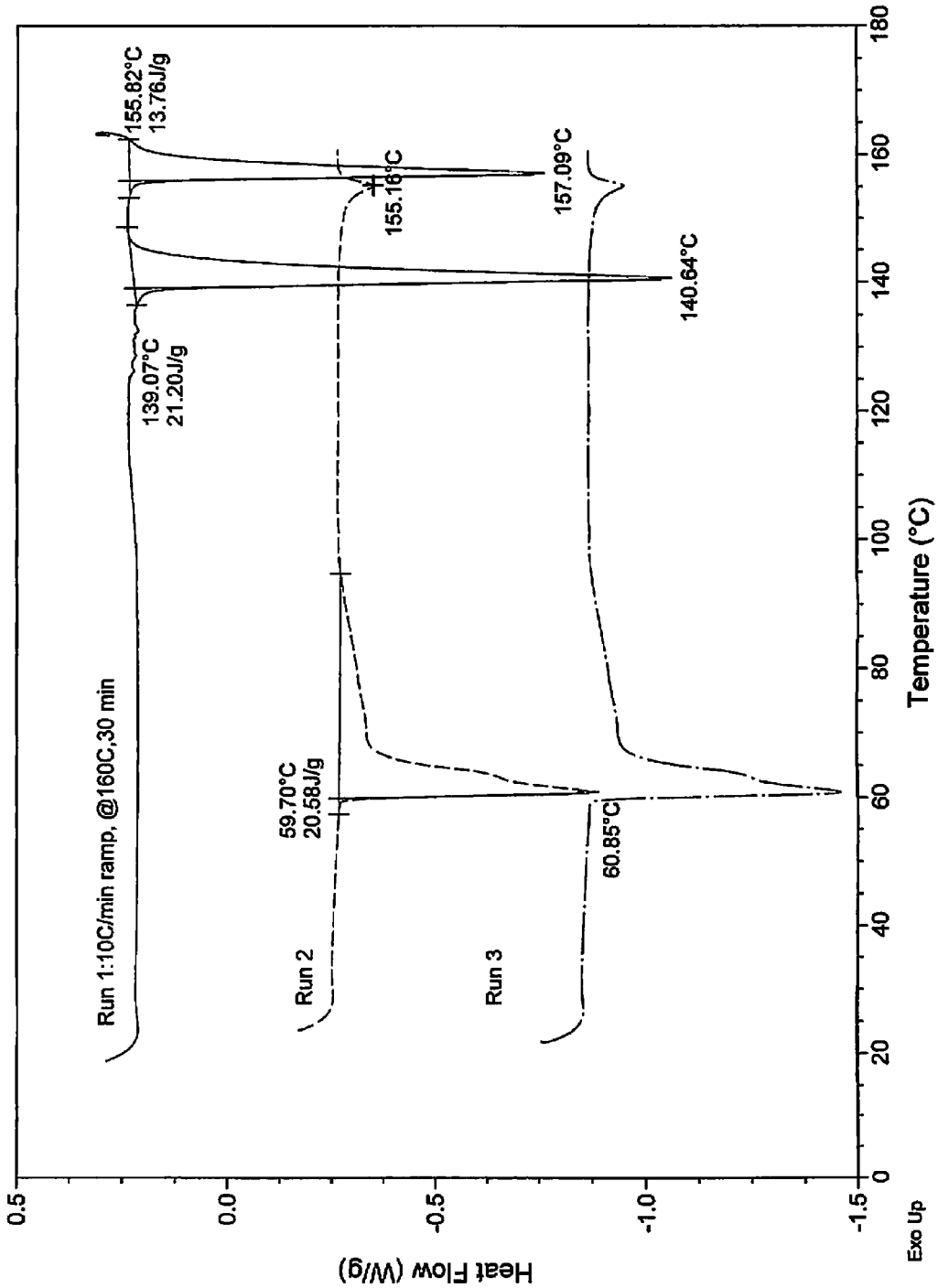
FIG. 2 is a differential scanning calorimetry trace of TIM composition sample F.

In a further embodiment, an eutectic alloy of tin and bismuth powder (melting point 138 C), in a weight ratio of tin to bismuth of Sn:Bi::48:52 is used in combination with indium powder (melting point 158 C), in which the indium is present in a weight ratio of 1:1 with the Sn:Bi alloy. When heat is applied to the TIM, the polymer resin acts as a flux to facilitate the formation of an In—Sn—Bi eutectic alloy having a melting point of 60 C. The polymer resin is crosslinked lightly to form a soft gel matrix within the In—Sn—Bi alloy. The evidence of in-situ formation of the In—Sn—Bi alloy with a melting point of 60 C is shown in FIG. 2, a differential scanning calorimetry trace of composition sample F. Run 1 showed two distinct peaks at 138 C and 158 C, which can be associated with the melting of Sn—Bi and In, respectively. In the repeated heating cycles (runs 2 and 3), a very strong peak at about 60 C was observed while the peaks at 138 C and 158 C almost completely disappeared. The 60 C peak is associated with the formation of In—Sn—Bi eutectic alloy.

Figure 1:
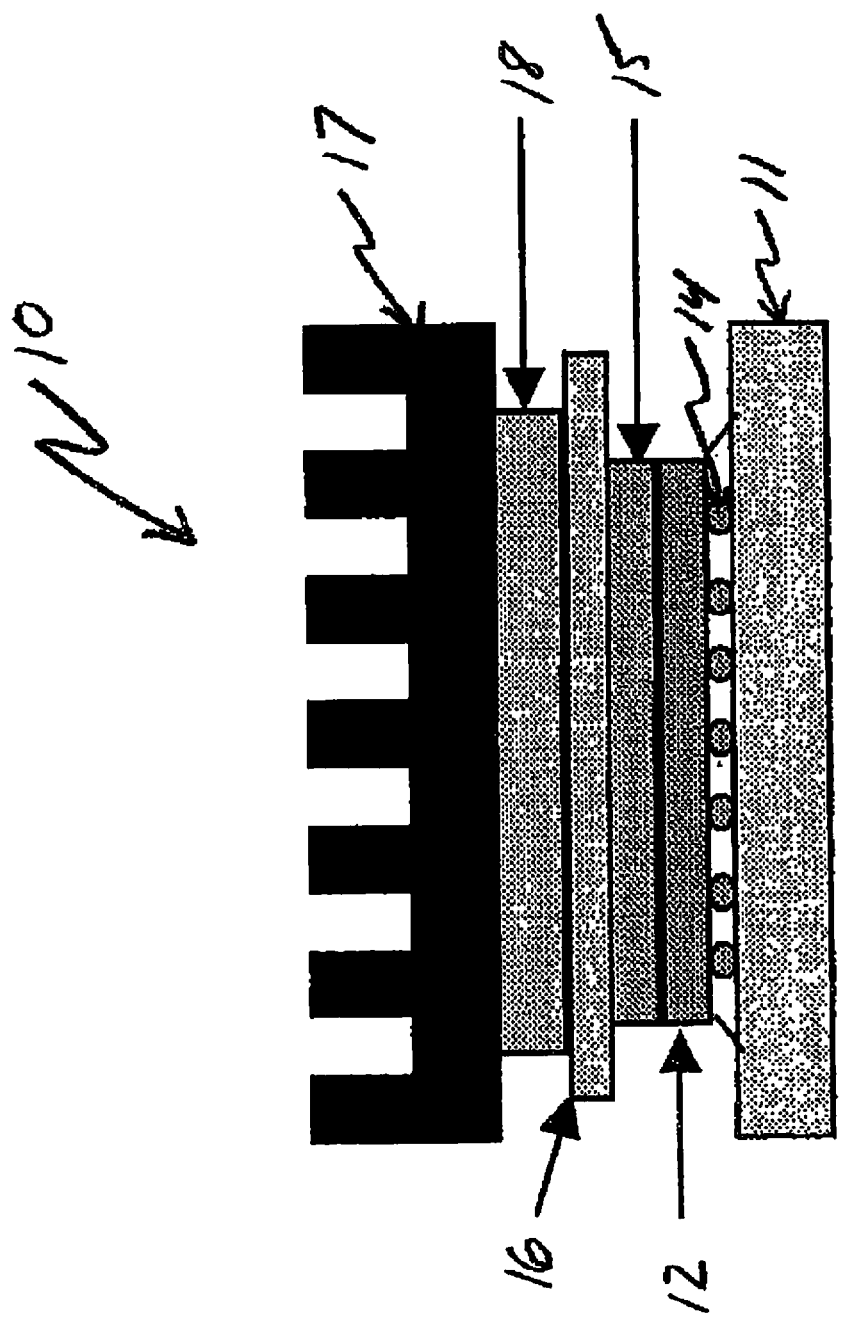
FIG. 1 is a side view of an electronic component having a heat sink, a heat spreader, and thermal interface material.

In one embodiment illustrated in FIG. 1, an electronic component 10 utilizing two layers of thermal interface materials comprises a substrate 11 that is attached to a silicon die 12 via interconnects 14. The silicon die generates heat that is transferred through thermal interface material 15 that is adjacent at least one side of the die. Heat spreader 16 is positioned adjacent to the thermal interface material and acts to dissipate a portion of the heat that passes through the first thermal interface material layer. Heat sink 17 is positioned adjacent to the heat spreader to dissipate any transferred thermal energy. A thermal interface material 18 is located between the heat spreader and the heat sink. The thermal interface material 18 is commonly thicker than the thermal interface material 15.

EXAMPLES

Compositions were prepared to contain the components in weight percent shown in the below Table. The inventive samples are identified as E, F, G, H, and J, and have viscosities suitable for dispensing. They all consist of a liquid reactive mixture of polymer resins and high melting point solder powders. Indium powder has a melting point of 158 C, and tin-bismuth alloy powder has a melting point of 138 C.

The TIM compositions were tested for thermal conductivity by measuring the resistance within a TIM composition disposed between a silicon die and a copper plank. The silicon die was heated and the heat input measured using a combination of a voltage and current meter. The heat traveled through the TIM to the copper plank, and the temperature on the copper plank was read by a thermocouple. Resistance was calculated from these values.

As the TIM material was subjected to the heat traveling from the heated silicon die to the copper plank, the epoxidized nutshell oil and/or dimer fatty acid polymer resin acted as a flux for the solder materials and facilitated the formation of In—Sn—Bi eutectic alloy. This alloy displayed a melting point of 60 C, considered a low melting temperature. The polymer resin became crosslinked lightly to form a soft gel matrix within the In—Sn—Bi alloy. The formation of alloys having a melting range from about 60 C to about 100 C are particularly useful for efficient thermal heat transfer of semiconductor devices, particularly those with operating temperature ranges from about 70 to 100 C.

The comparative samples are A, B, C, and D and were tested in the same manner as the inventive samples.

The results also are reported in the Table and show that the inventive compositions containing the epoxy resin derived from nutshell oil and/or epoxidized dimer fatty acid at a sufficient level exhibited stable and lower thermal impedance compared to the comparative compositions. Low thermal impedance is essential for heat dissipation, the property desired in a thermal interface material.

| | SAMPLE ID AND COMPOSITION IN PERCENT BY WEIGHT | | | | | | | | |
|---|---|---|---|---|---|---|---|---|---|
| COMPONENT | A | B | C | D | E | F | G | H | J |
| Epoxidized nutshell oil | | 3 | | 5.98 | 10 | 9.9 | 9.8 | 4.95 | |
| Epoxidized dimer | | | 2.98 | | | | | 4.95 | 9.9 |

-continued

| COMPONENT | A | B | C | D | E | F | G | H | J |
|---|---|---|---|---|---|---|---|---|---|
| fatty acid | | | | | | | | | |
| Dimer bismaleimide | | | 1.5 | | | | | | |
| Dicyclopentenyl-oxyethyl methacrylate | | | 4.5 | | | | | | |
| p-Octyloxy-phenyliodonium hexafluoro-antimonate | | | | | | 0.1 | 0.2 | 0.1 | 0.1 |
| Bisphenol F epoxy | 3 | | | | | | | | |
| Cycloaliphatic epoxy | 2.98 | | | | | | | | |
| Dicumyl peroxide | | | 0.02 | | | | | | |
| Dicarboxylic acid | 4 | 4 | 3.98 | 4 | | | | | |
| Zinc phosphate | 0.02 | 0.02 | | 0.02 | | | | | |
| Indium powder | 45 | 40 | 40 | 40 | 40 | 40 | 40 | 40 | 40 |
| Tin-Bismuth alloy powder | 45 | 40 | 40 | 40 | 40 | 40 | 40 | 40 | 40 |
| Silver coated Boron Nitride | 0 | 10 | 10 | 10 | 10 | 10 | 10 | 10 | 10 |
| VISCOSITY (CPS at room temperature) | | | | | | | | | |
| Cone-and-Plate @ 5RPM | 35000 | 20000 | 30000 | 17000 | 12500 | 14000 | 15000 | 16000 | 22000 |
| THERMAL IMPEDANCE (taken at room temperature after conditions stated) (C · cm²/Watt) | | | | | | | | | |
| Before cure | 0.15 | 0.15 | 0.25 | 0.16 | 0.16 | 0.16 | 0.14 | 0.17 | 0.18 |
| Cured at 160 C. for 30 min | 0.17 | 0.2 | 0.27 | 0.2 | 0.13 | 0.13 | 0.13 | 0.15 | 0.16 |
| Baked at 150 C. for 100 hrs | 0.4 | 0.25 | 0.33 | 0.26 | 0.25* | 0.14 | 0.16 | 0.17 | 0.18 |
| 500 cycles from −55 C. to 125 C. | 0.38 | 0.25 | 0.3 | 0.28 | 0.15 | 0.15 | 0.15 | 0.16 | 0.17 |

*Thermal Impedance of Composition sample E, which had no curing agent, showed some degradation in thermal impedance after being baked at 150 C., although the thermal reliability was unchanged after the thermal cycling test

The invention claimed is:

1. A thermal interface material comprising:
   (a) an epoxy resin derived from nutshell oil embraced by the structures:

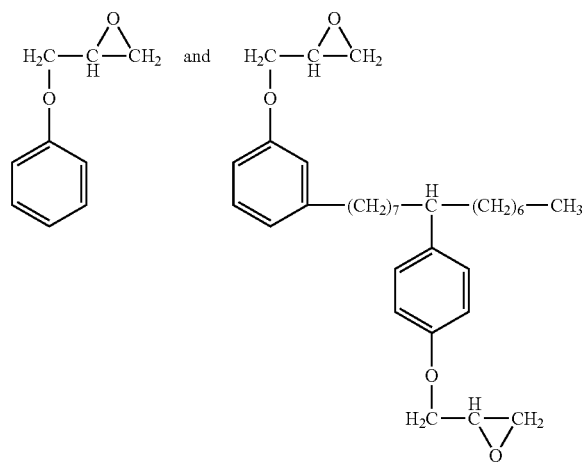

or
   (b) an epoxidized dimer fatty acid
   or
   (c) both (a) and (b) and
   (d) fusible metal particles substantially devoid of added lead.

2. The thermal interface material of claim 1 in which the epoxidized dimer fatty acid has the structure

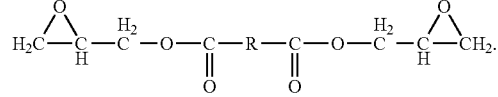

R = $C_{34}H_{68}$

3. The thermal interface material of claim 1 in which the epoxy resin derived from nutshell oil is present in an amount ranging from 2 to 30 weight percent of the total composition, and in which the epoxidized dimer fatty acid is present in an amount ranging from 2 to 30 weight percent of the total composition.

4. The thermal interface material of claim 1, in which both the epoxy resin derived from nutshell oil and the epoxidized dimer fatty acid are present in an amount ranging from 2 to 30 weight percent of the total composition in a weight ratio of epoxy resin to epoxidized dimer fatty acid of 1:1.

5. The thermal interface material of claim 1 in which the fusible metal particles are present in an amount ranging from 40 to 95 weight percent of the total composition.

6. The thermal interface material of claim 5 in which the metal particles are selected from tin, bismuth, an alloy of tin:bismuth, indium, silver coated boron nitride, and mixtures of these.

7. The thermal interface material of claim 6 in which the alloy of tin:bismuth has a weight ratio of Sn:Bi::48:52.

8. The thermal interface material of claim 7 further comprising In, in which the In is present in a weight ratio to Sn:Bi alloy of 1:1.

9. An assembly comprising a semiconductor chip; a heat spreader; and the thermal interface material of claim 1 therebetween.

10. An assembly comprising a heat spreader; a heat sink; and the thermal interface material of claim 1 therebetween.

11. The thermal interface material of claim 1 further comprising a catalyst.

* * * * *

UNITED STATES PATENT AND TRADEMARK OFFICE
CERTIFICATE OF CORRECTION

PATENT NO. : 8,648,460 B2
APPLICATION NO. : 13/439091
DATED : February 11, 2014
INVENTOR(S) : My Nhu Nguyen and Chew Beng Chan Page 1 of 1

It is certified that error appears in the above-identified patent and that said Letters Patent is hereby corrected as shown below:

In the Specification

Column 1, line 55: Change "and for" to -- and/or --.

Column 1, line 60: Change "for an" to -- /or an --.

Signed and Sealed this
Fifth Day of April, 2016

Michelle K. Lee
*Director of the United States Patent and Trademark Office*